(12) United States Patent
Onodera et al.

(10) Patent No.: US 9,413,335 B2
(45) Date of Patent: Aug. 9, 2016

(54) HIGH-FREQUENCY MODULE

(71) Applicant: Murata Manufacturing Co., Ltd., Nagaokakyo-shi, Kyoto-fu (JP)

(72) Inventors: Syuichi Onodera, Nagaokakyo (JP); Syuji Yamato, Nagaokakyo (JP); Tadaji Takemura, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 56 days.

(21) Appl. No.: 14/445,431

(22) Filed: Jul. 29, 2014

(65) Prior Publication Data
US 2015/0042417 A1 Feb. 12, 2015

(30) Foreign Application Priority Data

Aug. 6, 2013 (JP) ................................. 2013-163267

(51) Int. Cl.
*H03H 9/64* (2006.01)
*H03H 9/72* (2006.01)
*H03H 9/00* (2006.01)
*H03H 9/60* (2006.01)

(52) U.S. Cl.
CPC ........... *H03H 9/6433* (2013.01); *H03H 9/6479* (2013.01); *H03H 9/725* (2013.01); *H03H 9/0009* (2013.01); *H03H 9/0057* (2013.01); *H03H 9/605* (2013.01); *H03H 9/6483* (2013.01)

(58) Field of Classification Search
CPC ... H03H 9/6433; H03H 9/6479; H03H 9/725; H03H 9/0009; H03H 9/0057; H03H 9/605; H03H 9/6483

USPC .......................... 333/133, 187, 188, 193–196
See application file for complete search history.

(56) References Cited

U.S. PATENT DOCUMENTS

| | | | | |
|---|---|---|---|---|
| 7,808,935 | B2* | 10/2010 | Koga | ...................... H01P 1/213 333/132 |
| 2008/0266023 | A1* | 10/2008 | Tanaka | ................. H03H 9/0576 333/133 |
| 2009/0147707 | A1 | 6/2009 | Koga et al. | |
| 2011/0221546 | A1* | 9/2011 | Yamaji | ................. H03H 9/1071 333/193 |
| 2012/0119847 | A1 | 5/2012 | Iwaki et al. | |
| 2014/0118084 | A1 | 5/2014 | Takemura | |

FOREIGN PATENT DOCUMENTS

| | | |
|---|---|---|
| JP | 2012-109818 A | 6/2012 |
| WO | 2007/102560 A1 | 9/2007 |
| WO | 2013/008435 A1 | 1/2013 |

* cited by examiner

*Primary Examiner* — Robert Pascal
*Assistant Examiner* — Jorge Salazar, Jr.
(74) *Attorney, Agent, or Firm* — Keating & Bennett, LLP

(57) ABSTRACT

A high-frequency module includes a multilayer substrate, a filter substrate, a cover layer, a connection electrode, and inductors. The filter substrate includes a first principal surface on which an IDT electrode included in a filter unit is disposed, and the first principal surface faces a mounting surface of the multilayer substrate. The cover layer is spaced apart from and opposite to the first principal surface of the filter substrate. The connection electrode connects the multilayer substrate and the filter substrate. One of the inductors is connected between the filter unit and a first external connection terminal. Another one of the inductors is connected between the filter unit and the ground. The inductors are disposed inside the multilayer substrate. The inductors are inductively coupled to each other.

19 Claims, 13 Drawing Sheets

HIGH-FREQUENCY MODULE

BACKGROUND OF THE INVENTION

1. Field of the Invention

The present invention relates to a high-frequency module including a plurality of filter elements.

2. Description of the Related Art

A device having a wireless communication function, such as a mobile device, includes a filter circuit to allow only high-frequency signals of a desired frequency to pass therethrough and to attenuate high-frequency signals of frequencies other than the desired frequency.

One example filter circuit including a plurality of surface acoustic wave (SAW) filters is described in Japanese Unexamined Patent Application Publication No. 2012-109818. Specifically, the filter circuit in Japanese Unexamined Patent Application Publication No. 2012-109818 is one in which the plurality of SAW filters are connected in series between input and output terminals. The filter circuit further includes SAW filters disposed between the ground and the connection lines connecting the plurality of SAW filters connected in series.

In the filter circuit described in Japanese Unexamined Patent Application Publication No. 2012-109818, an inductor or a series circuit including an inductor and a capacitor (referred to as a correction circuit) is connected in parallel to the series circuit of the SAW filters. The correction circuit is adjusted such that a high-frequency signal having a frequency outside the pass band and passing through a circuit unit including the group of SAW filters (signal to be suppressed) and a signal to be suppressed passing through the correction circuit have the same amplitude and opposite phases. The signals to be suppressed are cancelled out at the connection between the circuit unit including the group of SAW filters and the correction circuit, and these signals are not output from the output terminal.

However, the above-described configuration needs to include a correction circuit consisting of the inductor or of the series circuit including the inductor and the capacitor prepared only for improving the attenuation characteristic, in addition to the main circuit unit including the group of SAW filters having the filter function.

Accordingly, the number of components in the filter circuit is large, the size of the filter circuit is increased, and it is unsuitable for current devices such as mobile terminals where miniaturization is desired.

SUMMARY OF THE INVENTION

Accordingly, preferred embodiments of the present invention provide a high-frequency module including a filter circuit having an excellent attenuation characteristic for frequencies outside the pass band and having a significantly reduced size.

According to a preferred embodiment of the present invention, a first high-frequency module includes a first external connection terminal, a second external connection terminal, a filter unit connected between the first and second external connection terminals, a matching circuit connected between the filter unit and at least one of the first and second external connection terminals, and an inductor connected between the filter unit and a ground. The first high-frequency module has the characteristics described below.

The first high-frequency module further includes a multilayer substrate, a flat filter substrate including a first principal surface on which an IDT electrode included in the filter unit is disposed, the first principal surface facing a mounting surface of the multilayer substrate, a flat cover layer spaced apart from and opposite to the first principal surface of the filter substrate, and a connection electrode having a shape that protrudes from the first principal surface and that extends through the cover layer and connects the multilayer substrate and the filter substrate. The matching circuit is disposed inside the multilayer substrate or the cover layer. The inductor and the matching circuit are inductively or capacitively coupled to each other.

This configuration includes a sub propagation path through a path of an inductive coupling or capacitive coupling caused by an inductor and a matching circuit connected between the ground and the filter unit, in addition to a main propagation path along which high-frequency signals pass through the filter unit. The sub propagation path has an amplitude characteristic and a phase characteristic different from those in the main propagation path, depending on the coupling degree of the inductive coupling or capacitive coupling. The transmission characteristic as the high-frequency module is adjustable by adjusting the amplitude characteristic and the phase characteristic of the sub propagation path. Thus, because the transmission characteristic of the high-frequency module is adjustable, for example, the attenuation characteristic is improved without including an additional inductor or capacitor.

The high-frequency module is achieved using the filter unit having a wafer level package (WLP) and the multilayer substrate. This enables size reduction of the high-frequency module.

According to a preferred embodiment of the present invention, a second high-frequency module includes a first external connection terminal, a second external connection terminal, a filter unit connected between the first and second external connection terminals, a matching circuit connected between the filter unit and at least one of the first and second external connection terminals, and an inductor connected between the filter unit and a ground. The second high-frequency module has the characteristics described below.

The second high-frequency module further includes a multilayer substrate, a flat filter substrate including a first principal surface on which an IDT electrode included in the filter unit is disposed, the first principal surface being spaced apart from and opposite to a mounting surface of the multilayer substrate, a connection electrode having a shape that protrudes from the first principal surface and connecting the multilayer substrate and the filter substrate, and a resin layer surrounding the mounting surface of the multilayer substrate provided with the filter substrate. The matching circuit is disposed inside the multilayer substrate. The inductor and the matching circuit are inductively or capacitively coupled to each other.

With this configuration, the transmission characteristic of the high-frequency module is adjustable, for example, the attenuation characteristic is improved without including an additional inductor or capacitor. The high-frequency module is achieved using the filter unit having a bare chip structure. This enables size reduction of the high-frequency module.

The first or second high-frequency module may preferably have the following configuration. The filter unit may include a first series connection terminal connected to the first external connection terminal, a second series connection terminal connected to the second external connection terminal, a shunt connection terminal connected to the ground with the inductor disposed therebetween, a plurality of series connection type filter elements connected in series between the first series connection terminal and the second series connection terminal by a plurality of connection lines, and a shunt connection type filter element including a first end connected to at least one of the connection lines and a second end connected to the shunt connection terminal.

With this configuration, the desired pass band characteristic and the attenuation characteristic for frequencies outside the pass band of the filter unit are achieved using a combination of the pass band characteristics and attenuation characteristics of the plurality of filter elements.

The first or second high-frequency module may preferably have the following configuration. The inductively or capacitively coupled inductor and matching circuit may be inductively or capacitively coupled so as to allow an impedance outside the pass band of the filter unit to change.

As described in this configuration, adjusting the coupling mode or coupling degree enables the characteristic for frequencies outside the pass band, that is, the attenuation characteristic to be changed without changing the characteristic for the pass band.

The first or second high-frequency module may preferably have the following configuration. The inductively or capacitively coupled inductor and matching circuit may be inductively or capacitively coupled so as to allow a frequency at an attenuation pole outside a pass band of the filter unit to change.

In this configuration, the frequency at the attenuation pole is adjusted as the adjusting mode of the attenuation characteristic.

In the first or second high-frequency module, the matching circuit may be a series connection type matching circuit connected in series between the first external connection terminal and the first series connection terminal or connected in series between the second external connection terminal and the second series connection terminal.

In the first or second high-frequency module, the matching circuit may be a shunt connection type matching circuit connected between the ground and the connection line connecting the first external connection terminal and the first series connection terminal or connected between the ground and the connection line connecting the second external connection terminal and the second series connection terminal.

These configurations describe specific examples of the connection mode of the matching circuit. By properly determining the connection mode, the attenuation characteristic is appropriately adjusted as described above while at the same time the impedance matching between the filter unit and the outside is appropriately performed.

The first or second high-frequency module may have the following configuration. The filter unit may include a third terminal and a second filter unit. The second filter unit may be connected between the third terminal and the connection line connecting the first series connection terminal and the filter element connected to the first series connection terminal.

This configuration achieves a combined separator (e.g., duplexer) including the first series connection terminal as a common terminal and the second series connection terminal and the third terminal as individual terminals.

In the first or second high-frequency module, the inductor may be mounted on the mounting surface of the multilayer substrate or disposed inside the multilayer substrate, and the inductor and the matching circuit may be near each other.

In the first high-frequency module, the inductor may be disposed inside the cover layer, and the inductor and the matching circuit may be near each other.

In the first high-frequency module, both of the inductor and the matching circuit may be disposed inside the multilayer substrate or inside the cover layer.

In the first high-frequency module, the inductor and the matching circuit may be disposed on different layers.

In the high-frequency module, the inductor and the matching circuit may at least partly overlap each other as seen in a plan view.

These configurations describe specific construction examples of the matching circuit and the inductor. These configurations reliably and stably achieve the coupling between the inductor and the matching circuit.

The first high-frequency module may further include a ground electrode disposed between the inductor and the matching circuit.

With this configuration, the coupling degree between the inductor and the matching circuit is adjustable by changing the arrangement, size, or the like of the ground electrode.

In the second high-frequency module, both of the inductor and the matching circuit may be disposed inside the multilayer substrate.

In the second high-frequency module, the inductor and the matching circuit may be disposed on different layers.

In the second high-frequency module, the inductor and the matching circuit may at least partly overlap each other as seen in a plan view.

These configurations describe specific construction examples of the matching circuit and the inductor. These configurations reliably and stably achieve the coupling between the inductor and the matching circuit.

The second high-frequency module may further include a ground electrode disposed between the inductor and the matching circuit.

With this configuration, the coupling degree between the inductor and the matching circuit is adjustable by changing the arrangement, size, or the like of the ground electrode.

Accordingly, a high-frequency module including the small filter circuit having an excellent attenuation characteristic for frequencies outside the pass band is achieved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
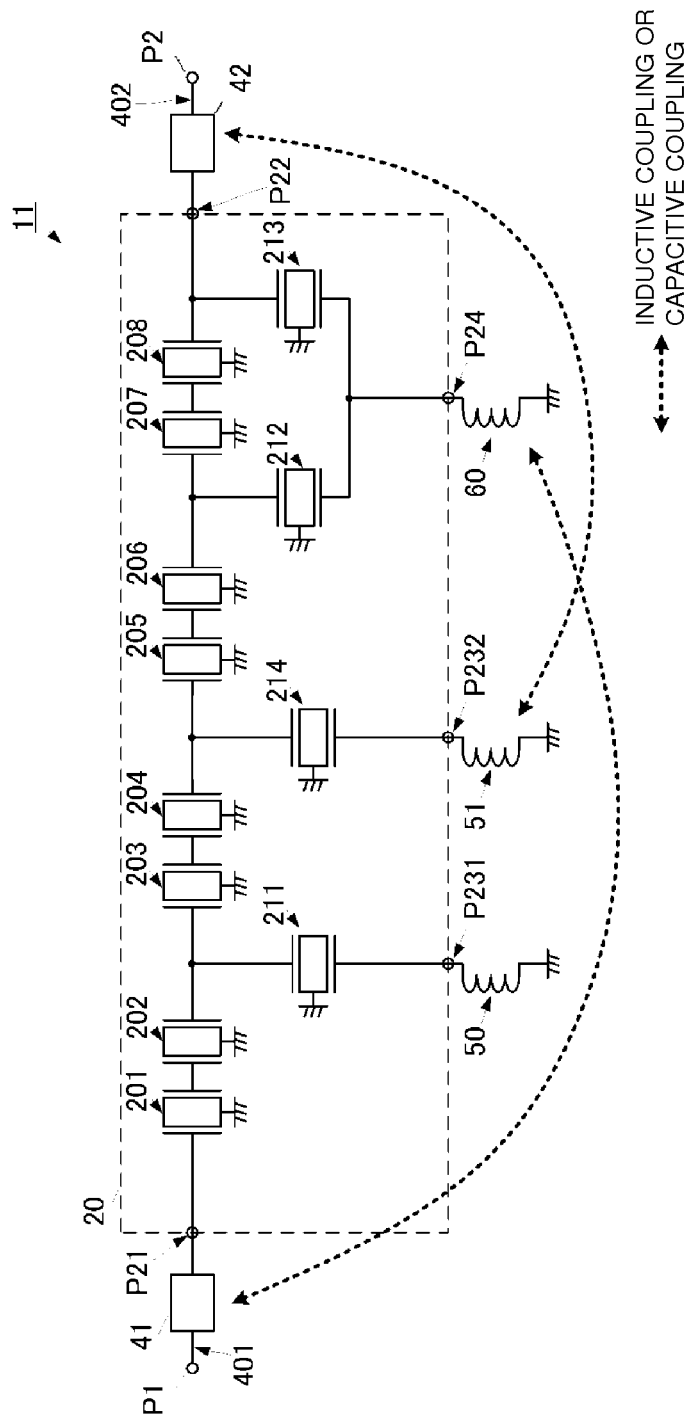
FIG. 1 is a circuit block diagram that illustrates a first circuit example of a high-frequency module according to a preferred embodiment of the present invention.
Figure 2:
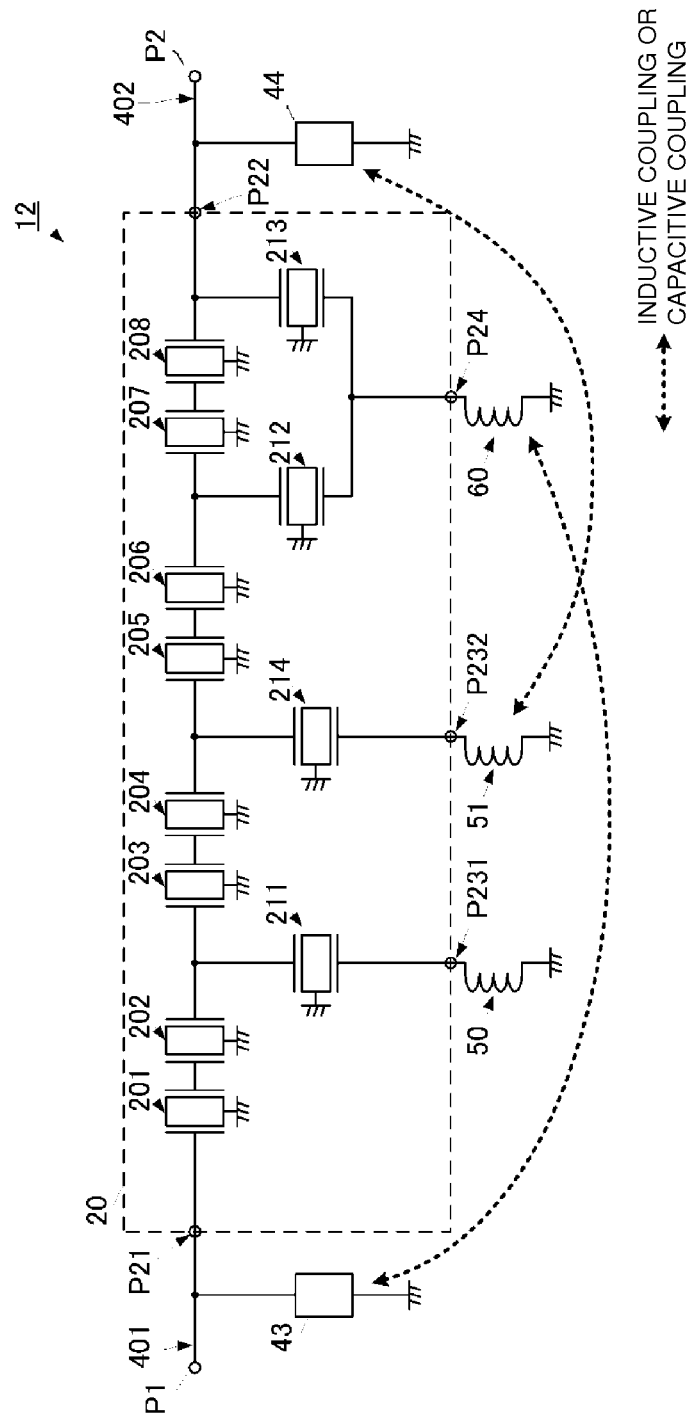
FIG. 2 is a circuit block diagram that illustrates a second circuit example of the high-frequency module according to a preferred embodiment of the present invention.
Figure 3:
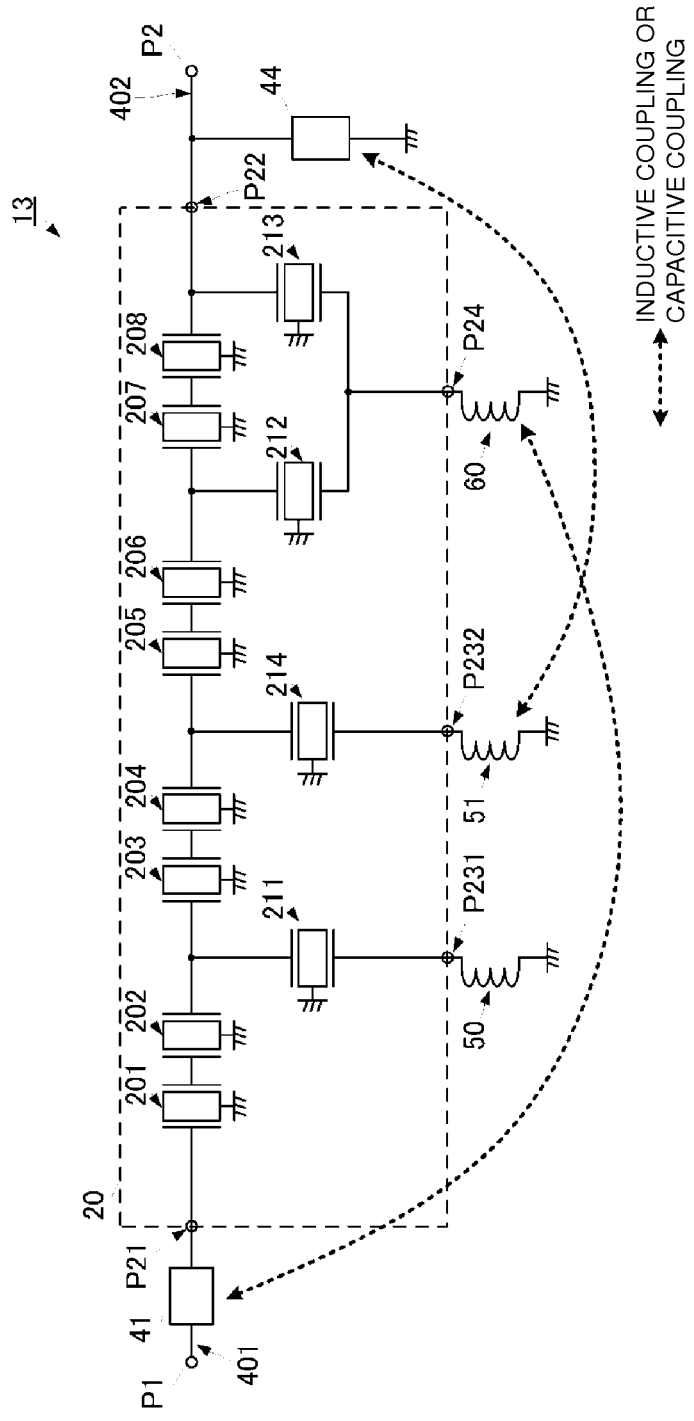
FIG. 3 is a circuit block diagram that illustrates a third circuit example of the high-frequency module according to a preferred embodiment of the present invention.
Figure 4:
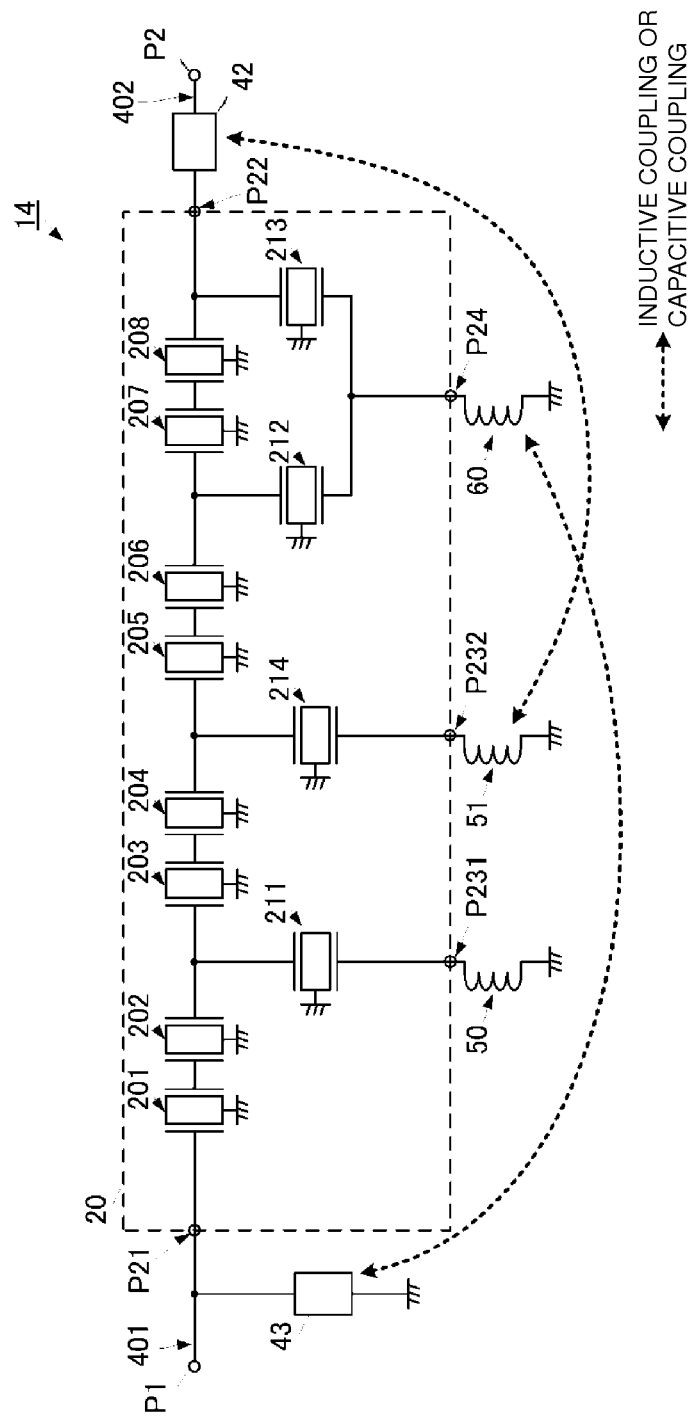
FIG. 4 is a circuit block diagram that illustrates a fourth circuit example of the high-frequency module according to a preferred embodiment of the present invention.
Figure 5A:
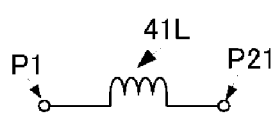
FIGS. 5A to 5H are circuit diagrams that illustrate specific examples of matching circuits in the high-frequency modules illustrated in FIGS. 1 to 4.
Figure 5E:
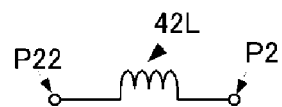
Figure 5B:
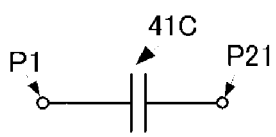
Figure 5F:
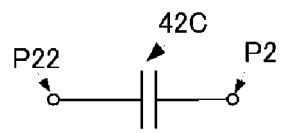
Figure 5C:
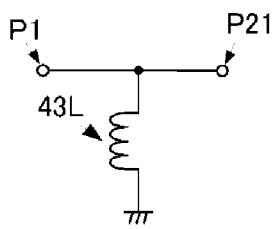
Figure 5G:
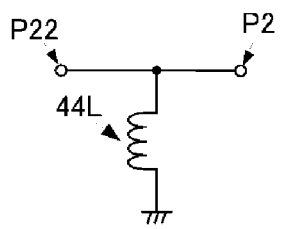
Figure 5D:
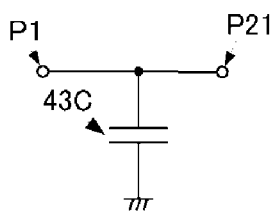
Figure 5H:
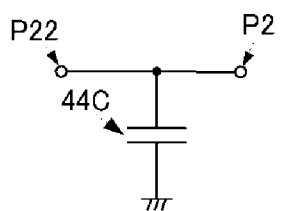

A high-frequency module according to preferred embodiments of the present invention is described below with reference to the drawings. FIG. 1 is a circuit block diagram that illustrates a first circuit example of the high-frequency module according to a preferred embodiment of the present invention. FIG. 2 is a circuit block diagram that illustrates a second circuit example of the high-frequency module according to a preferred embodiment of the present invention. FIG. 3 is a circuit block diagram that illustrates a third circuit example of the high-frequency module according to a preferred embodiment of the present invention. FIG. 4 is a circuit block diagram that illustrates a fourth circuit example of the high-frequency module according to a preferred embodiment of the present invention. For the sake of facilitating visual recognition, FIGS. 1 to 4 illustrate typical examples of the high-frequency module using inductive coupling or capacitive coupling. FIGS. 5A, 5B, 5C, and 5D are circuit diagrams that illustrate specific examples of a matching circuit near a first external connection terminal. FIGS. 5E, 5F, 5G, and 5H are circuit diagrams that illustrate specific examples of a matching circuit near a second external connection terminal.

A common structure in high-frequency modules 11, 12, 13, and 14 illustrated in FIGS. 1 to 4, respectively, is first described below.

Each of the high-frequency modules 11, 12, 13, and 14 includes a first external connection terminal P1, a second external connection terminal P2, and a filter unit 20. The filter unit 20 is connected between the first external connection terminal P1 and the second external connection terminal P2.

The filter unit 20 includes a first series connection terminal P21, a second series connection terminal P22, first shunt connection terminals P231 and P232, and a second shunt connection terminal P24. The first series connection terminal P21 is connected to the first external connection terminal P1 through a series connection type matching circuit or a shunt connection type matching circuit, both of which are described below. The second series connection terminal P22 is connected to the second external connection terminal P2 through the series connection type matching circuit or the shunt connection type matching circuit, both of which are described below.

The first shunt connection terminal P231 is connected to the ground through an inductor 50. The first shunt connection terminal P232 is connected to the ground through an inductor 51. The second shunt connection terminal P24 is connected to the ground through an inductor 60.

The filter unit 20 includes a plurality of SAW resonators 201, 202, 203, 204, 205, 206, 207, and 208 (hereinafter referred to simply as plurality of SAW resonators 201-208 when they are collectively described). These SAW resonators correspond to "series connection type filter elements". The filter unit 20 further includes a plurality of SAW resonators 211, 212, 213, and 214. These SAW resonators correspond to "shunt connection type filter element".

Each of the plurality of SAW resonators 201-208 and 211, 212, 213, and 214 has a resonant frequency and functions as a band pass filter (BPF) having an individual band pass characteristic. The plurality of SAW resonators 201-208 are connected in series between the first series connection terminal P21 and the second series connection terminal P22 by a plurality of connection lines.

The SAW resonator 211 is connected between the first shunt connection terminal P231 and the connection line connecting the SAW resonators 202 and 203. The SAW resonator 214 is connected between the first shunt connection terminal P232 and the connection line connecting the SAW resonators 204 and 205.

The SAW resonator 212 is connected between the second shunt connection terminal P24 and the connection line connecting the SAW resonators 206 and 207. The SAW resonator 213 is connected between the second shunt connection terminal P24 and the connection line connecting the SAW resonator 208 and the second series connection terminal P22. That is, the second shunt connection terminal P24 is a terminal common to the SAW resonators 212 and 213 and collectively connects first ends of the SAW resonators 212 and 213 to the ground.

The filter unit 20 defines a ladder filter, as in the above-described configuration, and achieves the desired pass band characteristic and the desired attenuation characteristic for frequencies outside the pass band as the filter unit 20 by using a combination of the band pass characteristics and attenuation characteristics of the SAW resonators 201-208 and 211, 212, 213, and 214. The number and arrangement of the SAW resonators may be changed to obtain the frequency band of signals to be passed and the desired attenuation characteristic for frequencies outside the pass band.

The above-described circuit configuration is common to the high-frequency modules 11, 12, 13, and 14. Specific examples of individual circuit configurations in the high-frequency modules are described below.

First Circuit Example

The high-frequency module 11 illustrated in FIG. 1 includes series connection type matching circuits 41 and 42. One of the matching circuits 41 and 42 is optional.

The matching circuit 41 is connected between the first series connection terminal P21 in the filter unit 20 and the first external connection terminal P1. Examples of the matching circuit 41 may include an inductor 41L illustrated in FIG. 5A connected in series between the first series connection terminal P21 and the first external connection terminal P1 and a capacitor 41C illustrated in FIG. 5B connected in series between the first series connection terminal P21 and the first external connection terminal P1. The matching circuit 41 has a device value (inductance or capacitance) set to a value at which impedance matching between a circuit connected to the first external connection terminal P1 and the filter unit 20 is achieved.

The matching circuit 42 is connected between the second series connection terminal P22 in the filter unit 20 and the second external connection terminal P2. Examples of the matching circuit 42 may include an inductor 42L illustrated in FIG. 5E connected in series between the second series connection terminal P22 and the second external connection terminal P2 and a capacitor 42C illustrated in FIG. 5F connected in series between the second series connection terminal P22 and the second external connection terminal P2. The matching circuit 42 has a device value (inductance or capacitance) set to a value at which impedance matching between a circuit connected to the second external connection terminal P2 and the filter unit 20 is achieved.

At least one of the matching circuits 41 and 42 is inductively coupled to at least one of the inductors 50, 51, and 60 or capacitively coupled to at least a portion of the conductors including the inductors 50, 51, and 60. When the coupled matching circuit is an inductor, that matching circuit is inductively coupled to at least one of the inductors 50, 51, and 60 or capacitively coupled to at least a portion of the conductors constituting the inductors 50, 51, and 60. When the coupled matching circuit is a capacitor, that matching circuit is capacitively coupled to at least a portion of the conductors constituting the inductors 50, 51, and 60.

For example, when the matching circuit 41 includes the inductor 41L, the inductor 41L is inductively coupled to at least one of the inductors 50, 51, and 60 or capacitively coupled to at least a portion of the conductors constituting the inductors 50, 51, and 60. When the matching circuit 41 includes the capacitor 41C, the capacitor 41C is capacitively coupled to at least a portion of the conductors constituting the inductors 50, 51, and 60.

For example, when the matching circuit 42 includes the inductor 42L, the inductor 42L is inductively coupled to at least one of the inductors 50, 51, and 60 or capacitively coupled to at least a portion of the conductors constituting the inductors 50, 51, and 60. When the matching circuit 42 includes the capacitor 42C, the capacitor 42C is capacitively coupled to at least a portion of the conductors constituting the inductors 50, 51, and 60.

As described above, the coupled inductor and matching circuit are connected in a high-frequency way. For example, when the matching circuit 41 includes the inductor 41L and the inductor 41L and the inductor 60 are inductively coupled to each other (see FIG. 1), an inductive coupling circuit having a mutual inductance is established between the inductor 41L (matching circuit 41) and the inductor 60. Thus, high-frequency signals pass through not only a main propagation path extending through the filter unit 20 between the first external connection terminal P1 and the second external connection terminal P2, and some high-frequency signals pass through a sub propagation path extending through the inductor 41L (matching circuit 41), the inductive coupling circuit, and the inductor 60.

Therefore, the high-frequency module 11 has a combined transmission characteristic in which the transmission characteristic of the main propagation path and that of the sub propagation path are combined.

The amplitude and phase of a high-frequency signal passing through the sub propagation path are adjustable by adjusting the coupling mode and the coupling degree of the coupled matching circuit and inductor. In other words, the transmission characteristic of the sub propagation path are adjustable. Examples of the transmission characteristic may include the attenuation characteristic (amplitude characteristic) and the phase characteristic.

In addition, the adjustment in the coupling mode and the coupling degree enables the provision of the sub propagation path to act on only the attenuation characteristic for frequencies outside the pass band without acting on the transmission characteristic for a frequency band of high-frequency signals to be passed as the high-frequency module 11 (desired high-frequency signals).

In this manner, the adjustment in the transmission characteristic in the sub propagation path adjusts the transmission characteristic as the high-frequency module 11. For example, as described below, the attenuation characteristic for frequencies outside the pass band is adjusted.

Unlike traditional configurations, additional inductors and capacitors configured to adjust the transmission characteristic of the high-frequency filter are not necessary, and thus the high-frequency filter having the desired attenuation characteristic is achieved using a simple configuration. Accordingly, the high-frequency filter is significantly reduced in size.

By the mutual induction component caused by the above-described coupling, an effective inductance value of each of the inductor 41L (matching circuit 41) and the inductor 60 is increased. This also leads to a more reduced line length of each of the inductor 41L and the inductor 60.

Second Circuit Example

The high-frequency module 12 illustrated in FIG. 2 includes shunt connection type matching circuits 43 and 44. One of the matching circuits 43 and 44 is optional.

The matching circuit 43 is connected between the ground and a connection line 401 connecting the first series connection terminal P21 in the filter unit 20 and the first external connection terminal P1. Examples of the matching circuit 43 may include an inductor 43L illustrated in FIG. 5C connected between the ground and the connection line 401 connecting the first series connection terminal P21 and the first external connection terminal P1 and a capacitor 43C illustrated in FIG. 5D connected between the ground and the connection line 401 connecting the first series connection terminal P21 and the first external connection terminal P1. The matching circuit 43 has a device value (inductance or capacitance) set to a value at which impedance matching between a circuit connected to the first external connection terminal P1 and the filter unit 20 is achieved.

The matching circuit 44 is connected between the ground and a connection line 402 connecting the second series connection terminal P22 in the filter unit 20 and the second external connection terminal P2. Examples of the matching circuit 44 may include an inductor 44L illustrated in FIG. 5G connected between the ground and the connection line 402 connecting the second series connection terminal P22 and the second external connection terminal P2 and a capacitor 44C illustrated in FIG. 5H connected between the ground and the connection line 402 connecting the second series connection terminal P22 and the second external connection terminal P2. The matching circuit 44 has a device value (inductance or capacitance) set to a value at which impedance matching between a circuit connected to the second external connection terminal P2 and the filter unit 20 is achieved.

At least one of the matching circuits 43 and 44 is inductively coupled to at least one of the inductors 50, 51, and 60 or capacitively coupled to at least a portion of the conductors including the inductors 50, 51, and 60. When the coupled matching circuit is an inductor, that matching circuit is inductively coupled to at least one of the inductors 50, 51, and 60 or capacitively coupled to at least a portion of the conductors constituting the inductors 50, 51, and 60. When the coupled matching circuit is a capacitor, that matching circuit is capacitively coupled to at least a portion of the conductors constituting the inductors 50, 51, and 60.

For example, when the matching circuit 43 includes the inductor 43L, the inductor 43L is inductively coupled to at least one of the inductors 50, 51, and 60 or capacitively coupled to at least a portion of the conductors constituting the inductors 50, 51, and 60. When the matching circuit 43 includes the capacitor 43C, the capacitor 43C is capacitively coupled to at least a portion of the conductors constituting the inductors 50, 51, and 60.

For example, when the matching circuit 44 includes the inductor 44L, the inductor 44L is inductively coupled to at least one of the inductors 50, 51, and 60 or capacitively coupled to at least a portion of the conductors constituting the inductors 50, 51, and 60. When the matching circuit 44 includes the capacitor 44C, the capacitor 44C is capacitively coupled to at least a portion of the conductors constituting the inductors 50, 51, and 60.

In this configuration, the coupled inductor and matching circuit are connected in a high-frequency way. For example, when the matching circuit 44 includes the capacitor 44C and the capacitor 44C and the conductor constituting the inductor 51 are capacitively coupled to each other (see FIG. 2), a capacitive coupling circuit having a coupling capacity is established between the capacitor 44C (matching circuit 44) and the conductor constituting the inductor 51. Thus high-frequency signals pass through not only a main propagation path extending through the filter unit 20 between the first external connection terminal P1 and the second external connection terminal P2, and some high-frequency signals pass through a sub propagation path extending through the inductor 51, the capacitive coupling circuit, and the capacitor 44C (matching circuit 44).

Therefore, the high-frequency module 12 has a combined transmission characteristic in which the transmission characteristic of the main propagation path and that of the sub propagation path are combined.

The high-frequency module 12 can also achieve the desired attenuation characteristic using a configuration simpler than traditional ones, as in the case of the above high-frequency module 11.

Third Circuit Example

The high-frequency module 13 illustrated in FIG. 3 includes the series connection type matching circuit 41 and the shunt connection type matching circuit 44.

The matching circuit 41 is connected between the first series connection terminal P21 in the filter unit 20 and the first external connection terminal P1. Examples of the matching circuit 41 may include the inductor 41L illustrated in FIG. 5A connected in series between the first series connection terminal P21 and the first external connection terminal P1 and the capacitor 41C illustrated in FIG. 5B connected in series between the first series connection terminal P21 and the first external connection terminal P1. The matching circuit 41 has a device value (inductance or capacitance) set to a value at which impedance matching between a circuit connected to the first external connection terminal P1 and the filter unit 20 is achieved.

The matching circuit 44 is connected between the ground and the connection line 402 connecting the second series connection terminal P22 in the filter unit 20 and the second external connection terminal P2. Examples of the matching circuit 44 may include the inductor 44L illustrated in FIG. 5G connected between the ground and the connection line 402 connecting the second series connection terminal P22 and the second external connection terminal P2 and the capacitor 44C illustrated in FIG. 5H connected between the ground and the connection line 402 connecting the second series connection terminal P22 and the second external connection terminal P2. The matching circuit 44 has a device value (inductance or capacitance) set to a value at which impedance matching between a circuit connected to the second external connection terminal P2 and the filter unit 20 is achieved.

At least one of the matching circuits 41 and 44 is inductively coupled to at least one of the inductors 50, 51, and 60 or capacitively coupled to at least a portion of the conductors consisting the inductors 50, 51, and 60. When the coupled matching circuit includes an inductor, that matching circuit is inductively coupled to at least one of the inductors 50, 51, and 60 or capacitively coupled to at least a portion of the conductors constituting the inductors 50, 51, and 60. When the coupled matching circuit includes a capacitor, that matching circuit is capacitively coupled to at least a portion of the conductors constituting the inductors 50, 51, and 60.

For example, when the matching circuit 41 includes the inductor 41L, the inductor 41L is inductively coupled to at least one of the inductors 50, 51, and 60 or capacitively coupled to at least a portion of the conductors constituting the inductors 50, 51, and 60. When the matching circuit 41 includes the capacitor 41C, the capacitor 41C is capacitively coupled to at least a portion of the conductors constituting the inductors 50, 51, and 60.

For example, when the matching circuit 44 includes the inductor 44L, the inductor 44L is inductively coupled to at least one of the inductors 50, 51, and 60 or capacitively coupled to at least a portion of the conductors constituting the inductors 50, 51, and 60. When the matching circuit 44 includes the capacitor 44C, the capacitor 44C is capacitively coupled to at least a portion of the conductors constituting the inductors 50, 51, and 60.

Therefore, the high-frequency module 13 has a combined transmission characteristic in which the transmission characteristic of the main propagation path extending through the filter unit 20 and that of the sub propagation path extending through the coupling unit are combined. The high-frequency module 13 also achieves the desired attenuation characteristic using a configuration simpler than traditional ones, as in the case of the above high-frequency modules 11 and 12.

Fourth Circuit Example

The high-frequency module 14 illustrated in FIG. 4 includes the series connection type matching circuit 42 and the shunt connection type matching circuit 43.

The matching circuit 42 is connected between the second series connection terminal P22 in the filter unit 20 and the second external connection terminal P2. Examples of the matching circuit 42 may include the inductor 42L illustrated in FIG. 5E connected in series between the second series connection terminal P22 and the second external connection terminal P2 and the capacitor 42C illustrated in FIG. 5F connected in series between the second series connection terminal P22 and the second external connection terminal P2. The matching circuit 42 has a device value (inductance or capacitance) set to a value at which impedance matching between a circuit connected to the second external connection terminal P2 and the filter unit 20 is achieved.

The matching circuit 43 is connected between the ground and the connection line 401 connecting the first series connection terminal P21 in the filter unit 20 and the first external connection terminal P1. Examples of the matching circuit 43 may include the inductor 43L illustrated in FIG. 5C connected between the ground and the connection line 401 connecting the first series connection terminal P21 and the first external connection terminal P1 and the capacitor 43C illustrated in FIG. 5D connected between the ground and the connection line 401 connecting the first series connection terminal P21 and the first external connection terminal P1. The matching circuit 43 has a device value (inductance or capacitance) set to a value at which impedance matching between a circuit connected to the first external connection terminal P1 and the filter unit 20 is achieved.

At least one of the matching circuits 42 and 43 is inductively coupled to at least one of the inductors 50, 51, and 60 or capacitively coupled to at least a portion of the conductors including the inductors 50, 51, and 60. When the coupled matching circuit is an inductor, that matching circuit is inductively coupled to at least one of the inductors 50, 51, and 60 or capacitively coupled to at least a portion of the conductors constituting the inductors 50, 51, and 60. When the coupled matching circuit is a capacitor, that matching circuit is capacitively coupled to at least a portion of the conductors constituting the inductors 50, 51, and 60.

For example, when the matching circuit 42 includes the inductor 42L, the inductor 42L is inductively coupled to at least one of the inductors 50, 51, and 60 or capacitively coupled to at least a portion of the conductors constituting the inductors 50, 51, and 60. When the matching circuit 42 includes the capacitor 42C, the capacitor 42C is capacitively coupled to at least a portion of the conductors constituting the inductors 50, 51, and 60.

For example, when the matching circuit 43 includes the inductor 43L, the inductor 43L is inductively coupled to at least one of the inductors 50, 51, and 60 or capacitively coupled to at least a portion of the conductors constituting the inductors 50, 51, and 60. When the matching circuit 43 includes the capacitor 43C, the capacitor 43C is capacitively coupled to at least a portion of the conductors constituting the inductors 50, 51, and 60.

Therefore, the high-frequency module 14 has a combined transmission characteristic in which the transmission characteristic of the main propagation path extending through the filter unit 20 and that of the sub propagation path extending through the coupling unit are combined. The high-frequency module 14 also achieves the desired attenuation characteristic using a configuration simpler than traditional ones, as in the case of the above high-frequency modules 11, 12, and 13.

Figure 6:
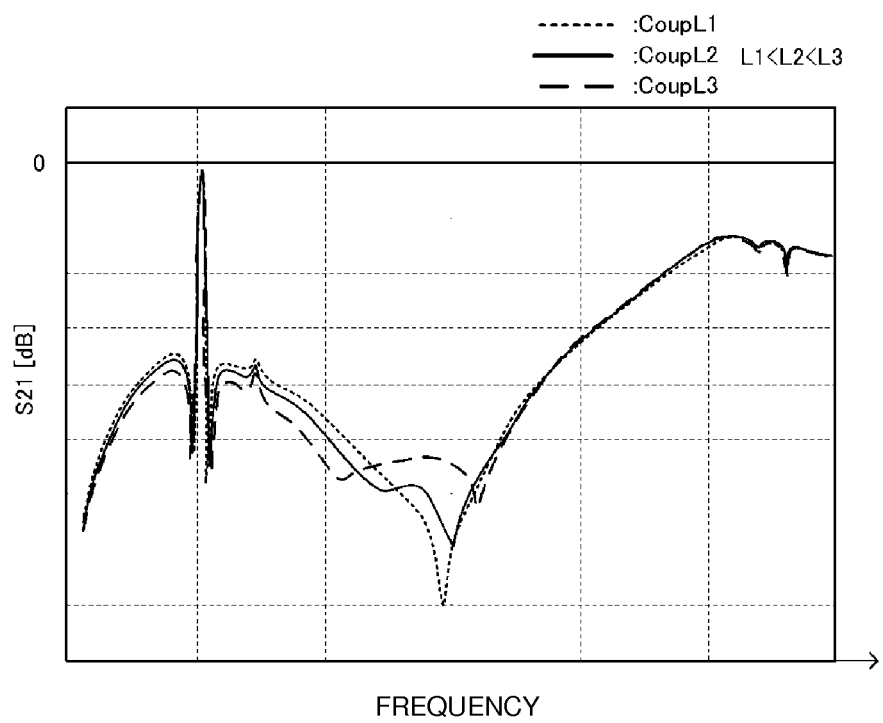
FIG. 6 is a graph that illustrates how a transmission characteristic of the high-frequency module varies when the coupling degree of the inductive coupling of the matching circuit and the inductor is changed.

FIG. 6 is a graph that illustrates how the transmission characteristic of the high-frequency module varies when the coupling degree of the inductive coupling of the matching circuit and the inductor is changed. The horizontal axis in FIG. 6 indicates the frequency, and the vertical axis in FIG. 6 indicates the attenuation of signals propagating from the first external connection terminal P1 to the second external connection terminal P2. The characteristic indicated by the dotted line in FIG. 6 is the one when the inductive coupling of the matching circuit and the inductor is weak. The characteristic indicated by the solid line in FIG. 6 is the one in which the inductive coupling is stronger than that indicated by the dotted line. The characteristic indicated by the long dashed line in FIG. 6 is the one in which the inductive coupling is stronger than that indicated by the solid line. The high-frequency module according to the present preferred embodiment preferably is a band pass filter with a pass band of approximately 800 MHz range.

FIG. 6 reveals that as the inductive coupling becomes stronger, the frequency at the attenuation pole appearing on the side higher than the pass band becomes higher. The frequency at the attenuation pole illustrated in FIG. 6 is the peak frequency located in a substantially center in the axis indicating the frequency.

The attenuation characteristic on the side higher than pass band is changed by appropriately setting the inductive coupling. For example, as the inductive coupling becomes weaker, the attenuation in the vicinity of the pass band becomes smaller, and the obtainable attenuation in the frequency at the attenuation pole becomes larger. As the inductive coupling becomes stronger, the obtainable attenuation in the vicinity of the pass band becomes larger.

As illustrated in FIG. 6, the frequency location, the frequency width, and the insertion loss in the pass band are not substantially affected by the strength of the inductive coupling and remain substantially unchanged.

Accordingly, with the configuration according to the present preferred embodiment, the attenuation characteristic for higher frequencies is adjusted to the desired characteristic by appropriately adjusting the coupling degree of the inductive coupling without changing the characteristic for the pass band. In other words, the high-frequency module having the desired pass band characteristic and attenuation characteristic is achieved.

Although not illustrated, when the matching circuit and the conductor consisting the inductor are capacitively coupled, the frequency at the attenuation pole appearing on the side higher than the pass band reduces with an increase in the strength of the capacitive coupling. The frequency location, the frequency width, and the insertion loss in the pass band are not substantially affected by the strength of the capacitive coupling and remain substantially unchanged. Accordingly, with the configuration according to the present preferred embodiment, the attenuation characteristic for higher frequencies is adjusted to the desired characteristic by appropriately adjusting the coupling degree of the capacitive coupling without changing the characteristic for the pass band.

Figure 7:
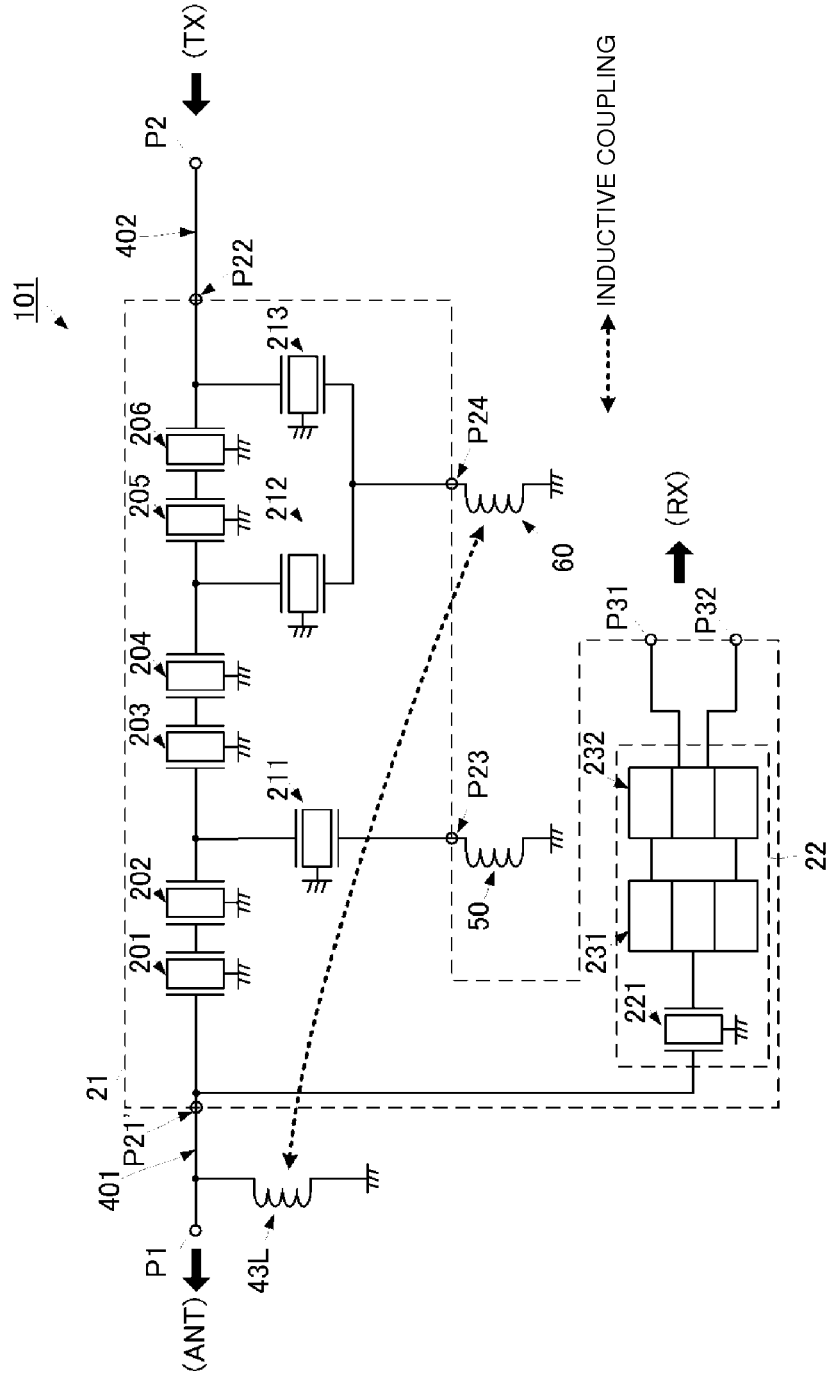
FIG. 7 is an equivalent circuit diagram of a high-frequency module having a duplexer configuration.

The high-frequency module having the above-described configuration may be used in a duplexer configuration illustrated in FIG. 7 as a specific application example. FIG. 7 is an equivalent circuit diagram of the high-frequency module having the duplexer configuration.

A high-frequency module 101 includes a filter unit 21, the first external connection terminal P1, the second external connection terminal P2, and a third external connection terminal functioning as third terminals P31 and P32 in the filter unit 21. One specific application example is the one in which the first external connection terminal P1 is connected to an antenna, the second external connection terminal P2 is connected to a transmission circuit, and the third external connection terminal (third terminals P31 and P32) is connected to a reception circuit.

The filter unit 21 includes a first series connection terminal P21', the second series connection terminal P22, a first shunt connection terminal P23, the second shunt connection terminal P24, and the third terminals P31 and P32.

The first series connection terminal P21' is connected to the first external connection terminal P1 through the connection line 401. The inductor 43L corresponding to the above-described matching circuit is connected between the connection line 401 and the ground. The second series connection terminal P22 is connected to the second external connection terminal P2 through the connection line 402.

The plurality of SAW resonators 201, 202, 203, 204, 205, and 206 are connected in series between the first series connection terminal P21' and the second series connection terminal P22 by the plurality of connection lines.

The connection line connecting the SAW resonators 202 and 203 is connected to the first shunt connection terminal P23 through the SAW resonator 211. The first shunt connection terminal P23 is connected to the ground through the inductor 50.

The connection line connecting the SAW resonators 204 and 205 is connected to the second shunt connection terminal P24 through the SAW resonator 212. The connection line connecting the SAW resonator 206 and the second series connection terminal P22 is connected to the second shunt connection terminal P24 through the SAW resonator 213. The second shunt connection terminal P24 is connected to the ground through the inductor 60.

With this configuration, the filter unit 21 achieves the desired first band pass characteristic and the desired first attenuation characteristic for frequencies outside the first pass band between the first and second series connection terminals in the filter unit 21 by using combination of the band pass characteristics and the attenuation characteristics of the SAW resonators 201 to 206, 211, 212, and 213 between the first series connection terminal P21' and the second series connection terminal P22 in the filter unit 21.

A SAW resonator 221 and longitudinally coupled SAW resonators 231 and 232 are connected in series between the first series connection terminal P21' and the third terminals P31 and P32. The SAW resonator 221 and longitudinally coupled SAW resonators 231 and 232 constitute a second filter unit 22. With this configuration, the filter unit 21 achieves the desired second band pass characteristic and the desired second attenuation characteristic for frequencies outside the second pass band between the first series connection terminal and the third terminals in the filter unit 21 by using a combination of the band pass characteristics and the attenuation characteristics of the SAW resonators 221, 231, and 232 between the first series connection terminal P21' and the third terminals P31 and P32. The second pass band is a frequency band different from the first pass band. The second pass band is set within an attenuation band range outside the first pass band.

The filter unit 21 functions as a duplexer in which the first series connection terminal P21' is a common terminal and the second series connection terminal P22 and the third terminals P31 and P32 are individual terminals.

In the high-frequency module 101, the inductor 43L is inductively coupled to at least one of the inductors 50 and 60. Adjusting the coupling degree of this inductive coupling adjusts the first attenuation characteristic.

With the configuration of the present preferred embodiment, the band width and the attenuation in a frequency range in which the attenuation in the first attenuation characteristic is large is adjusted such that it overlaps the second pass band. This is enabled by choosing an inductor coupled to the inductor 43L between the inductors 50 and 60 and adjusting the coupling degree of that coupling.

Figure 8:
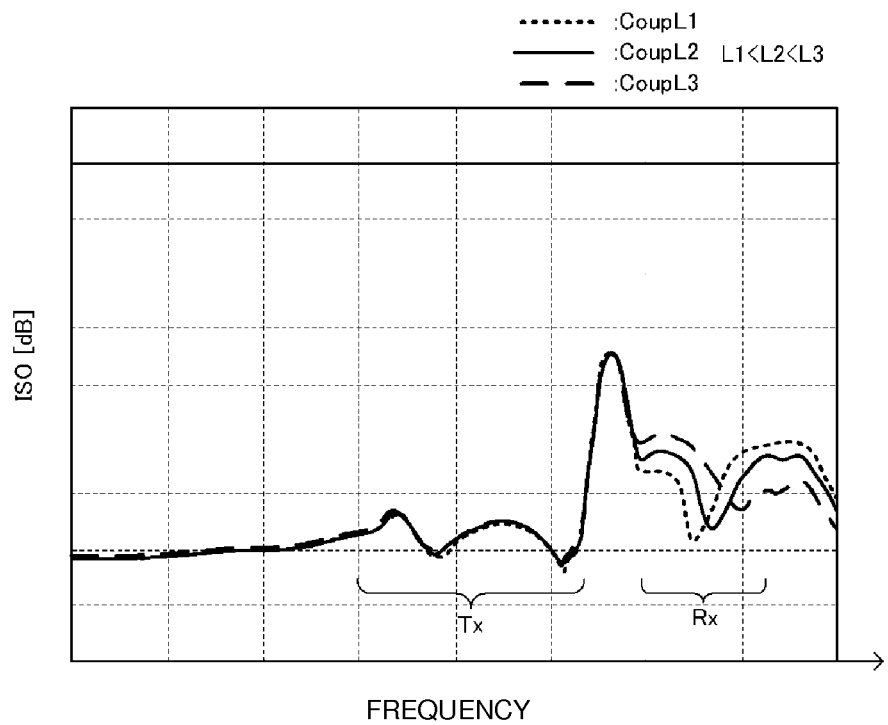
FIG. 8 is a graph that illustrates how isolation between second and third external connection terminals in the high-frequency module varies when the coupling degree of the inductive coupling between the matching circuit and the inductor is changed.

FIG. 8 is a graph that illustrates how isolation between the second and third external connection terminals in the high-frequency module varies when the coupling degree of the inductive coupling between the matching circuit and the inductor is changed. The horizontal axis in FIG. 8 indicates the frequency, and the vertical axis in FIG. 8 indicates the amount of isolation. FIG. 8 reveals that as the amount of isolation becomes smaller, the isolation between the second series connection terminal and the third terminals becomes stronger. The characteristic indicated by the dotted line in FIG. 8 is the one when the inductive coupling is weak. The characteristic indicated by the solid line in FIG. 8 is the one in which the inductive coupling is stronger than that indicated by the dotted line. The characteristic indicated by the long dashed line in FIG. 8 is the one in which the inductive coupling is stronger than that indicated by the solid line.

As illustrated in FIG. 8, as the inductive coupling becomes stronger, the frequency at the attenuation pole appearing in the vicinity of the pass band of a reception circuit Rx (near the third terminals) becomes higher. Thus adjusting the inductive coupling adjusts the amount of isolation and the isolation characteristic in the pass band of the reception circuit Rx. As illustrated in FIG. 8, even when the inductive coupling is adjusted, the amount of isolation and the isolation characteristic in the pass band of a transmission circuit Tx (near the second terminal) remain substantially unchanged.

With the configuration of the high-frequency module 101, the isolation characteristic between the second series connection terminal and the third terminals is appropriately adjusted. That is, the isolation characteristic between the transmission circuit and the reception circuit is optimized.

Although not illustrated, when the capacitor 43C is used as the matching circuit in place of the inductor 43L and that matching circuit is capacitively coupled to the conductor constituting the inductor, as the capacitive coupling becomes stronger, the frequency at the attenuation pole appearing in the vicinity of the pass band of the reception circuit Rx becomes lower. Thus, the amount of isolation and the isolation characteristic in the pass band of the reception circuit Rx (near the third terminals) is adjusted by adjustment in the capacitive coupling. Even when the capacitive coupling is adjusted, the amount of isolation and the isolation characteristic in the pass band of the transmission circuit Tx remain substantially unchanged. In this manner, the isolation characteristic between the second series connection terminal and the third terminals is also appropriately adjusted by adjustment in the capacitive coupling.

The high-frequency module having the above-described configuration is achieved using structures described below. Examples of structurally achieving the high-frequency module 101 having the above-described duplex configuration are described below.

Figure 9:
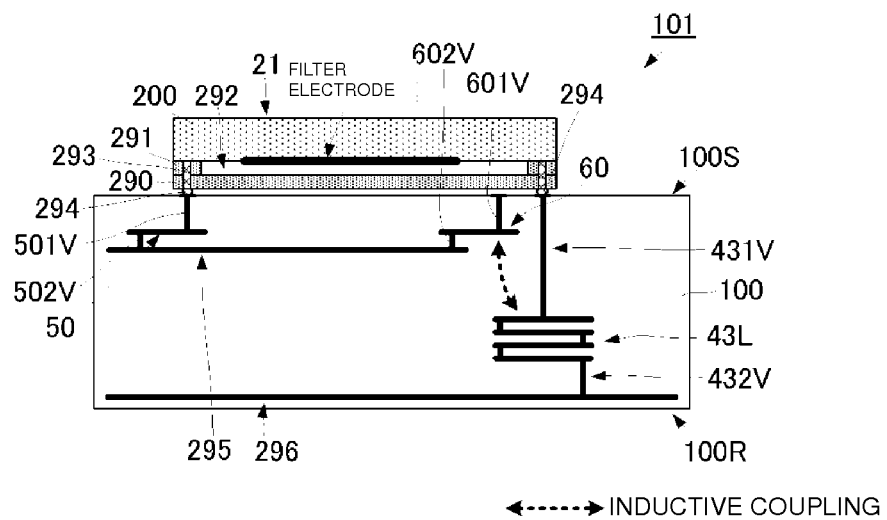
FIG. 9 is a schematic side view that illustrates a main construction in a first structure of the high-frequency module.

FIG. 9 is a schematic side view that illustrates a main construction of the high-frequency module. The high-frequency module 101 includes a multilayer substrate 100, a filter substrate 200, a cover layer 290, and a side cover layer 291.

The multilayer substrate 100 includes a plurality of dielectric layers being stacked. Electrodes of predetermined patterns are disposed on a top surface (mounting surface) 100S and inner layers in the multilayer substrate 100, and wiring patterns other than the filter unit 21 in the high-frequency module 101, the inductors 43L, 50, and 60 are disposed. Electrodes for external connection are disposed on a bottom surface 100R in the multilayer substrate 100, and these external connection electrodes constitute the above-described first external connection terminal P1, second external connection terminal P2, and third external connection terminal.

The filter unit 21 includes the filter substrate 200, the cover layer 290, the side cover layer 291, connection electrodes 293, and mounting electrodes 294.

The filter substrate 200 includes a flat piezoelectric substrate. The filter substrate 200 includes a first principal surface on which a filter electrode and a wiring pattern are disposed. Examples of the filter electrode may include an IDT electrode. The use of the IDT electrode on the principal surface of the piezoelectric substrate provide each of the above-described SAW resonators. The flat cover layer 290 is disposed near the first principal surface of the filter substrate 200. The cover layer 290 is made of an insulating material and has substantially the same shape of the filter substrate 200 as seen in a plan view. The cover layer 290 overlaps the filter substrate 200 as seen in a plan view, and the cover layer 290 is spaced apart from the first principal surface of the filter substrate 200 by an interval with a predetermined distance.

The side cover layer 291 is disposed between the first principal surface of the filter substrate 200 and the cover layer 290. The side cover layer 291 is also made of an insulating material. The side cover layer 291 extends along the entire perimeter of the filter substrate 200 and the cover layer 290 and is disposed in only a predetermined width range from the outer edge toward the inside as seen in a plan view. That is, the side cover layer 291 has a structure having a hole in its center or approximate center.

The above-described arrangement of the cover layer 290 and the side cover layer 291 enables the region where the filter electrode is disposed on the first principal surface of the filter substrate 200 to lie within an enclosed space 292 defined by the filter substrate 200, the cover layer 290, and the side cover layer 291. Accordingly, the resonant characteristics of the SAW resonators are improved, and the desired characteristic as the filter are accurately achieved.

Each of the connection electrodes 293 has a shape in which its first end is connected to the first principal surface of the filter substrate 200 and its second end is exposed to the opposite surface of the cover layer 290 to the filter substrate 200. The connection electrode 293 extends through the side cover layer 291 and the cover layer 290. The first end of the connection electrode 293 is connected to the wiring pattern on the first principal surface of the filter substrate 200.

Each of the mounting electrodes 294 has a shape in which it is connected to the second end of the connection electrode 293 and it protrudes from the opposite surface of the cover layer 290 to the filter substrate 200. The plurality of combinations of connection electrodes 293 and mounting electrodes 294 achieve the first series connection terminal P21', the second series connection terminal P22, the third terminals P31 and P32, the first shunt connection terminal P23, and the second shunt connection terminal P24 in the above-described filter unit 21. The connection electrode 293 may be connected to the mounting electrode 294 with a bump made of solder, aluminum, or the like disposed on the second end of the connection electrode 293.

With the above-described configuration, the filter unit 21 has a wafer level package (WLP) structure, and thus the filter unit 21 is small.

The filter unit 21 having the WLP structure is mounted on the top surface 100S of the multilayer substrate 100. Thus the filter unit 21 is connected to the first external connection terminal P1, the second external connection terminal P2, and the third external connection terminal.

The inductor 43L includes a spiral electrode disposed inside the multilayer substrate 100. The spiral electrode includes partially cut tubular linear electrode disposed on a plurality of dielectric layers included in the multilayer substrate 100 and interlayer connection electrodes. The linear electrodes on the dielectric layers are combined into a single linear electrode by being connected in the stacking direction with the interlayer connection electrodes. With this configuration, the spiral electrode having the central axis extending along the stacking direction is achieved. The spiral electrode constituting the inductor 43L includes a first end connected to a land electrode with a via conductor 431V disposed therebetween. On the land electrode, the mounting electrode 294 constituting the first series connection terminal P21' in the filter unit 21 is mounted. The land electrode is disposed on the top surface 100S of the multilayer substrate 100. The spiral electrode constituting the inductor 43L includes a second end connected to a ground electrode 296 with a via conductor 432V disposed therebetween. The ground electrode 296 is disposed inside the multilayer substrate 100 and positioned in the vicinity of the bottom surface 100R.

The inductor 50 includes a partially cut tubular linear electrode disposed inside the multilayer substrate 100 and positioned in the vicinity of the top surface 100S. The linear electrode includes a first end connected to a land electrode with a via conductor 501V disposed therebetween. On the land electrode, the mounting electrode 294 constituting the first shunt connection terminal P23 in the filter unit 21 is mounted. The linear electrode constituting the inductor 50 includes a second end connected to a ground electrode 295 disposed inside the multilayer substrate 100 with a via conductor 502V disposed therebetween.

The inductor 60 includes a partially cut tubular linear electrode disposed inside the multilayer substrate 100 and positioned in the vicinity of the top surface 100S. The linear electrode includes a first end connected to a land electrode with a via conductor 601V disposed therebetween. On the land electrode, the mounting electrode (not illustrated) constituting the second shunt connection terminal P24 in the filter unit 21 is mounted. The linear electrode constituting the inductor 60 includes a second end connected to the ground electrode 295 disposed inside the multilayer substrate 100 with a via conductor 602V disposed therebetween.

The spiral electrode constituting the inductor 43L and the linear electrode constituting the inductor 60 are near each other. The spiral electrode constituting the inductor 43L at least partly overlaps the linear electrode constituting the inductor 60 as seen in a plan view.

With this configuration, an inductive coupling occurs between the inductor 43L including the spiral electrode and the inductor 60 including the linear electrode, as indicated by the thick dashed line with the arrows in FIG. 9. This configuration achieves the high-frequency module 101 having the desired attenuation characteristic without including an additional element to adjust the attenuation characteristic.

The degree of coupling between the inductor 43L and the inductor 60 is adjusted by changing the distance between the spiral electrode constituting the inductor 43L and the linear electrode constituting the inductor 60 and the area where the spiral electrode and the linear electrode overlap each other. With this, the attenuation characteristic of the high-frequency module 101 is adjusted, and the desired attenuation characteristic is accurately achieved.

The spiral electrode constituting the inductor 43L and the linear electrode constituting the inductor 60 are disposed on different layers. The ground electrode 295 is located between the layer on which the spiral electrode is disposed and the layer on which the linear electrode is disposed. The degree of coupling between the inductor 43L and the inductor 60 is adjusted by changing the arrangement, size, or the like of the ground electrode 295.

Figure 10:
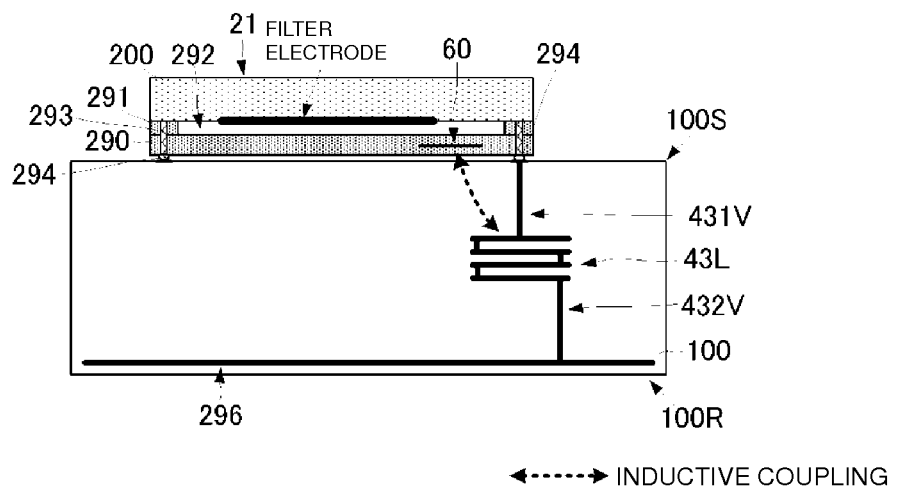
FIG. 10 is a schematic side view that illustrates a main construction in a first variation of the first structure of the high-frequency module.

As illustrated in FIG. 10, the inductor 60 preferably is disposed inside the cover layer 290, instead of inside the multilayer substrate 100. The inductor 60 includes a partially cut tubular linear electrode. The spiral electrode constituting the inductor 43L and the linear electrode constituting the inductor 60 are near each other. Thus, an inductive coupling can occur between the inductor 43L and the inductor 60, as indicated by the thick dashed line with the arrows in FIG. 10, as in the above-described case.

Figure 11:
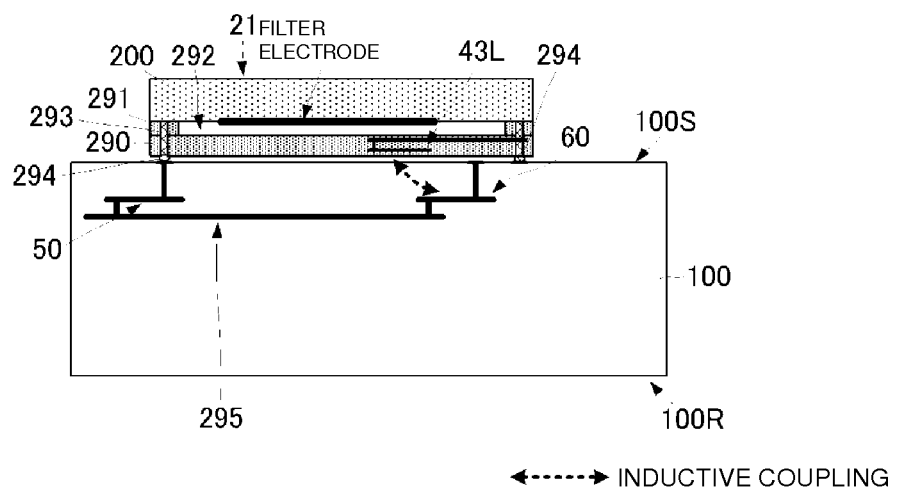
FIG. 11 is a schematic side view that illustrates a main construction in a second variation of the first structure of the high-frequency module.

As illustrated in FIG. 11, the inductor 43L may be disposed inside the cover layer 290, instead of inside the multilayer substrate 100. The inductor 43L includes the above-described spiral electrode. The spiral electrode constituting the inductor 43L and the linear electrode constituting the inductor 60 are near each other. Thus, an inductive coupling occurs between the inductor 43L and the inductor 60, as indicated by the thick dashed line with the arrows in FIG. 11, as in the above-described cases.

Although not illustrated, both the inductors 43L and 60 may be disposed within the cover layer 290, or the inductor 43L may be disposed inside the cover layer 290 and the inductor 60 may be disposed on the top surface 100S of the multilayer substrate 100.

Figure 12A:
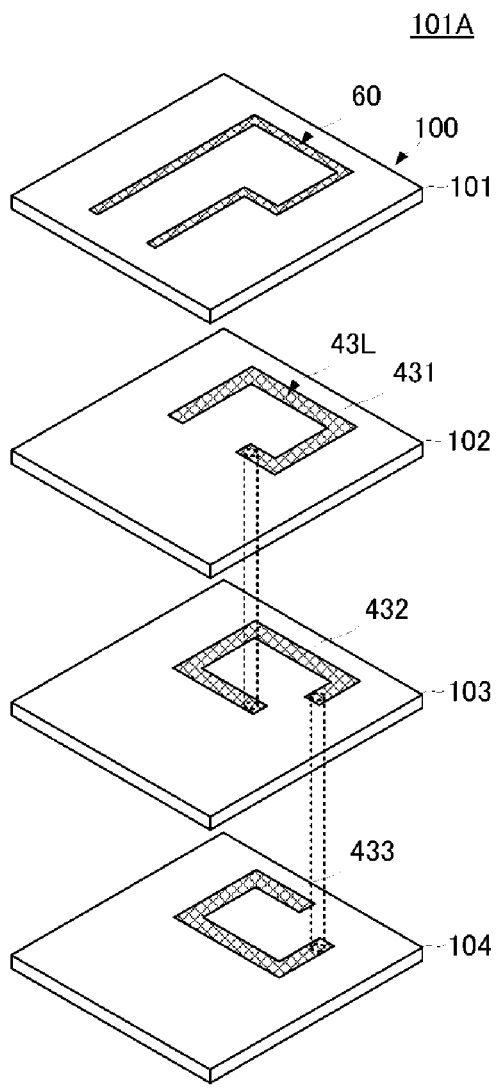
FIGS. 12A and 12B are schematic views that illustrate a main construction in a second structure of the high-frequency module.
Figure 12B:
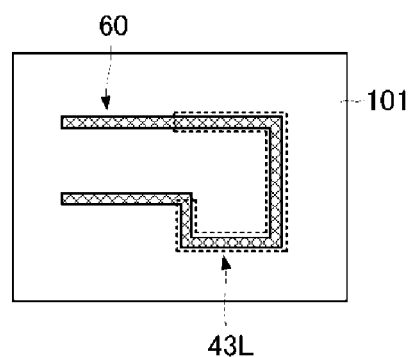

FIG. 12A is an exploded perspective view that illustrates a main construction of the high-frequency module. FIG. 12B is a schematic plan view that illustrates the main construction of the high-frequency module. Other configurations not illustrated in FIGS. 12A and 12B of a high-frequency module 101A are substantially the same as those illustrated in FIG. 9.

The multilayer substrate 100 includes dielectric layers 101, 102, 103, and 104. The dielectric layers 101, 102, 103, and 104 are stacked in this order. A partially cut tubular linear electrode is disposed on the dielectric layer 101. That linear electrode constitutes the inductor 60. Partially cut tubular linear electrodes 431, 432, and 433 are disposed on the dielectric layers 102, 103, and 104, respectively. The linear electrodes 431, 432, and 433 are connected in the stacking direction with interlayer connection electrodes disposed therebetween to define a single linear electrode. This linear electrode defines a spiral electrode having the central axis extending along the stacking direction. This spiral electrode constitutes the inductor 43L.

As illustrated in FIG. 12B, the spiral electrode constituting the inductor 43L overlaps the linear electrode constituting the inductor 60 as seen in a plan view. With this configuration, a strong inductive coupling occurs between the inductor 43L including the spiral electrode and the inductor 60 including the linear electrode. The degree of coupling between the inductor 43L and the inductor 60 can be adjusted by changing the distance between the spiral electrode constituting the inductor 43L and the linear electrode constituting the inductor 60 and the area where the spiral electrode and the linear electrode overlap each other. With this, the attenuation characteristic of the high-frequency module 101A is adjusted, and the desired attenuation characteristic is accurately achieved, as in the case of the above-described first structure.

As described above, an effective inductance value of each of the inductor 43L and the inductor 60 is increased using a mutual induction component caused by the inductive coupling. Thus, the line length of each of the spiral electrode constituting the inductor 43L and the linear electrode constituting the inductor 60 is further shortened. As described above, the spiral electrode and the linear electrode overlap each other as seen in a plan view. Therefore, a region necessary to place the spiral electrode and the linear electrode is significantly reduced. That is, the layout region in the multilayer substrate 100 is efficiently used.

Figure 13A:
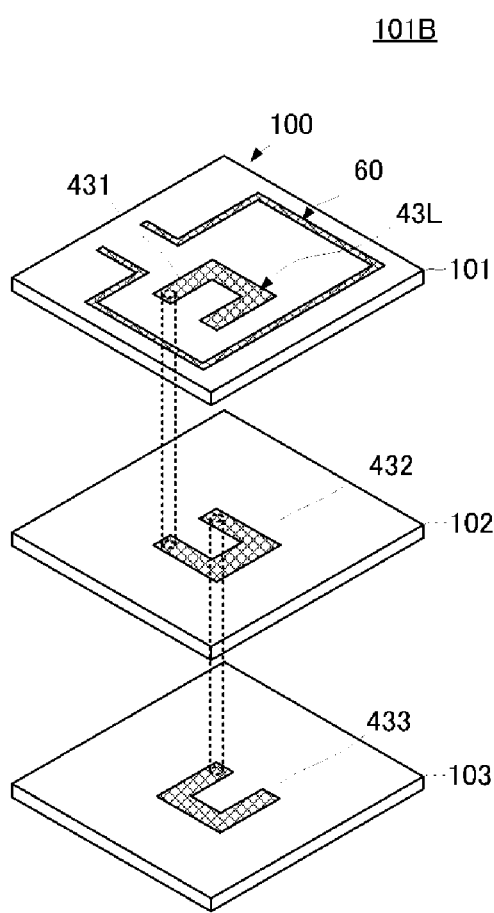
FIGS. 13A and 13B are schematic views that illustrate a main construction in a third structure of the high-frequency module.
Figure 13B:
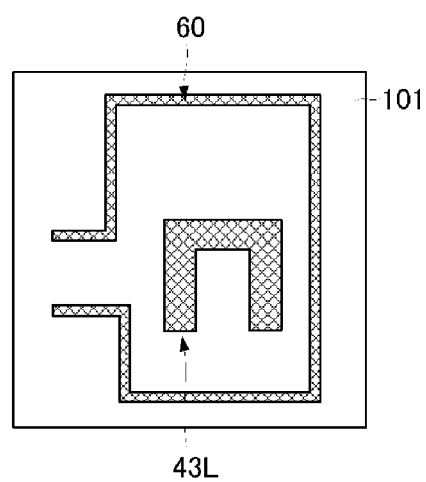

FIG. 13A is an exploded perspective view that illustrates a main construction of the high-frequency module. FIG. 13B is a schematic plan view that illustrates the main construction of the high-frequency module. Other configurations not illustrated in FIGS. 13A and 13B of a high-frequency module 101B are substantially the same as those illustrated in FIG. 9.

The multilayer substrate 100 includes dielectric layers 101, 102, and 103. The dielectric layers 101, 102, and 103 are stacked in this order. The partially cut tubular linear electrode constituting the inductor 60 is disposed on the dielectric layer 101. The partially cut tubular linear electrodes 431, 432, and 433 are disposed on the dielectric layers 101, 102, and 103, respectively. The linear electrodes 431, 432, and 433 are connected in the stacking direction with interlayer connection electrodes disposed therebetween to define a single linear electrode. This linear electrode defines a spiral electrode having the central axis extending along the stacking direction. This spiral electrode constitutes the inductor 43L.

As illustrated in FIG. 13B, the linear electrode constituting the inductor 60 surrounds the spiral electrode constituting the inductor 43L as seen in a plan view. With this configuration, a strong inductive coupling occurs between the inductor 43L including the spiral electrode and the inductor 60 including the linear electrode. Thus, the attenuation characteristic of the high-frequency module 101B is adjusted, and the desired attenuation characteristic is accurately achieved, as in the case of the above-described first structure or second structure.

As described above, the linear electrode constituting the inductor 60 surrounds the spiral electrode constituting the inductor 43L as seen in a plan view. Thus, the layout region in the multilayer substrate 100 is efficiently used, as in the second structure.

Figure 14A:
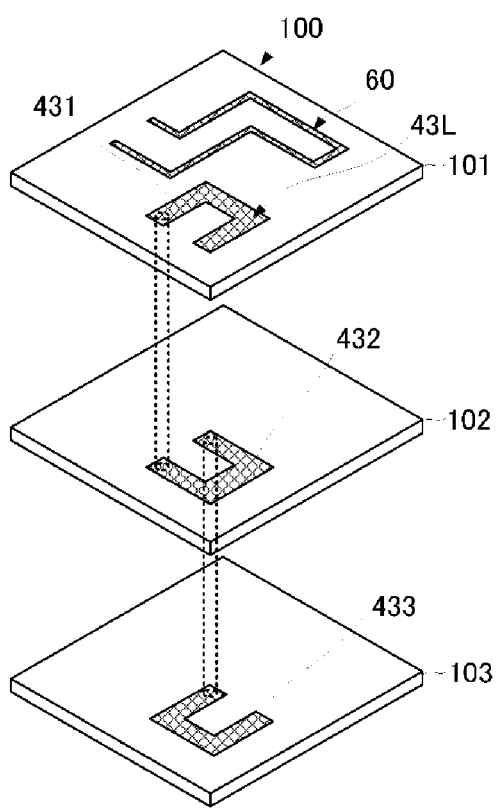
FIGS. 14A and 14B are schematic views that illustrate a main construction in a variation of the third structure of the high-frequency module.
Figure 14B:
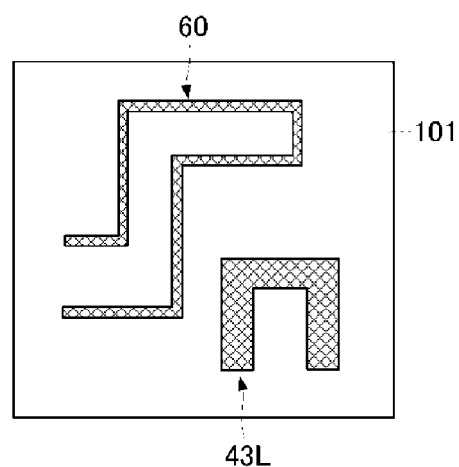

As illustrated in FIGS. 14A and 14B, the linear electrode constituting the inductor 60 may be near the spiral electrode constituting the inductor 43L without surrounding the spiral electrode. In this case, an inductive coupling also occurs between the inductor 43L including the spiral electrode and the inductor including the linear electrode. The layout region in the multilayer substrate 100 is efficiently used.

In FIGS. 12A, 12B, 13A, 13B, 14A, and 14B, the dielectric layer 101 may be the uppermost layer or may also be an inner layer. That is, the linear electrode constituting the inductor 60 may be disposed on the top surface of the multilayer substrate 100 or may be disposed inside the multilayer substrate 100.

Figure 15:
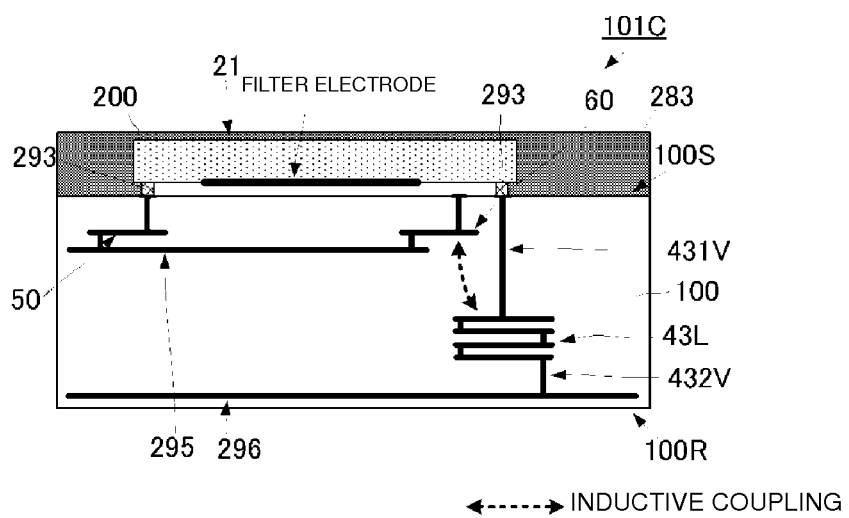
FIG. 15 is a schematic side view that illustrates a main construction in a fourth structure of the high-frequency module.

FIG. 15 is a schematic side view that illustrates a main construction of the high-frequency module. In a high-frequency module 101C illustrated in FIG. 15, the filter unit 21 is not achieved using the WLP structure illustrated in FIG. 9, but is achieved using a bare chip. Other configurations in the high-frequency module 101C are substantially the same as those in the high-frequency module 101 illustrated in FIG. 9, and are not described here.

The filter substrate 200 constituting the filter unit 21 includes a flat piezoelectric substrate. The filter substrate 200 includes a first principal surface on which a filter electrode and a wiring pattern are disposed. Examples of the filter electrode may include an IDT electrode. The filter substrate 200 is mounted using the connection electrodes 293 protruding from the first principal surface such that the first principal surface is spaced apart from the top surface 100S of the multilayer substrate 100 by a predetermined interval and is opposite thereto. Each of the connection electrodes 293 includes a first end connected to the wiring pattern on the first principal surface of the filter substrate 200. The connection electrode 293 includes a second end connected to the wiring pattern on the top surface 100S of the multilayer substrate 100. The top surface 100S provided with the filter substrate 200 of the multilayer substrate 100 is overlaid with a resin layer 283 to seal the filter substrate 200. The resin layer 283 is not applied on the IDT electrode, and the region where the IDT electrode is disposed is hollow.

This configuration provides the above-described SAW resonators. The plurality of connection electrodes 293 achieve the first series connection terminal P21', the second series connection terminal P22, the third terminals P31 and P32, the first shunt connection terminal P23, and the second shunt connection terminal P24 in the above-described filter unit 21.

In this configuration, an inductive coupling also occurs between the inductor 43L including the spiral electrode and the inductor 60 including the linear electrode, as indicated by the thick dashed line with the arrows in FIG. 15. Thus, the high-frequency module 101C having the desired attenuation characteristic is achieved, as in the first structure.

The electrode constituting the inductor 60 in the high-frequency module 101C is disposed inside the multilayer substrate 100. The linear electrode constituting the inductor 60 may be disposed on the top surface 100S of the multilayer substrate 100.

In the above-described structures, the linear electrode disposed inside or on the multilayer substrate 100 or disposed inside the cover layer 290 achieves the inductor 60. The inductor 60 may be achieved by mounting a mounting circuit element on the multilayer substrate 100.

An example where an inductor is used as a matching circuit is illustrated in the above-described structures.

A case where a capacitor is used as the matching circuit can also be achieved using substantially the same structure. For example, the capacitor may be achieved using a plurality of opposite flat electrodes on different layers in a multilayer substrate or a cover layer. The capacitor may be achieved using an electrode pattern on the top surface of the multilayer substrate.

The effect of the coupling between the matching circuit and the inductor on the attenuation characteristic increases with an increase in the number of SAW resonators disposed therebetween. For example, in the first structure (see FIG. 9), when the positional relationship between the spiral electrode constituting the inductor 43L and the linear electrode constituting the inductor 60 is the same, the effect on the attenuation characteristic increases with an increase in the number of SAW resonators disposed therebetween. Each of the matching circuits 41 to 44 may be made up of a plurality of inductors or a plurality of capacitors or may be a composite circuit including an inductor and a capacitor.

The above-described filter unit 20 preferably is a ladder filter. The filter unit may be a longitudinally coupled resonator filter. In this case, the high-frequency module having the desired attenuation characteristic is also achieved by adjusting the inductive coupling or capacitive coupling between the above-described first and second matching circuits.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency module comprising:
   a first external connection terminal;
   a second external connection terminal;
   a filter unit connected between the first and second external connection terminals;
   a matching circuit connected between the filter unit and at least one of the first and second external connection terminals;
   an inductor connected between the filter unit and a ground;
   a multilayer substrate;
   a flat filter substrate including a first principal surface on which an IDT electrode included in the filter unit is disposed, the first principal surface facing a mounting surface of the multilayer substrate;
   a flat cover layer spaced apart from and opposite to the first principal surface of the filter substrate; and
   a connection electrode having a configuration that protrudes from the first principal surface and that extends through the cover layer and connecting the multilayer substrate and the filter substrate; wherein
   the matching circuit is disposed inside the cover layer; and
   the inductor and the matching circuit are inductively or capacitively coupled to each other.

2. The high-frequency module according to claim 1, wherein the filter unit includes:
   a first series connection terminal connected to the first external connection terminal;
   a second series connection terminal connected to the second external connection terminal;
   a shunt connection terminal connected to the ground with the inductor disposed therebetween;
   a plurality of series connection type filter elements connected in series between the first series connection terminal and the second series connection terminal by a plurality of connection lines; and
   a shunt connection type filter element having a first end connected to at least one of the connection lines and a second end connected to the shunt connection terminal.

3. The high-frequency module according to claim 2, wherein the filter unit includes a third terminal and a second filter unit; and
   the second filter unit is connected between the third terminal and the connection line connecting the first series connection terminal and the filter element connected to the first series connection terminal.

4. The high-frequency module according to claim 1, wherein the inductively or capacitively coupled inductor and matching circuit are inductively or capacitively coupled so as to allow an impedance outside a pass band of the filter unit to change.

5. The high-frequency module according to claim 1, wherein the matching circuit is a first matching circuit connected between the filter unit and the first external connection terminal, and the high-frequency module further comprises a second matching circuit connected between the filter unit and the second external connection terminal, and two couplings selected from two inductive couplings, two capacitive couplings, or an inductive coupling and a capacitive coupling, between the inductor and the first and second matching circuits are formed.

6. The high-frequency module according to claim 1, wherein the matching circuit is a series connection type matching circuit connected in series between the first external connection terminal and a first series connection terminal or connected in series between the second external connection terminal and a second series connection terminal.

7. The high-frequency module according to claim 1, wherein the matching circuit is a shunt connection type matching circuit connected between the ground and a connection line connecting the first external connection terminal and the first series connection terminal or connected between the ground and a connection line connecting the second external connection terminal and the second series connection terminal.

8. The high-frequency module according to claim 1, further comprising a ground electrode disposed between the inductor and the matching circuit.

9. The high-frequency module according to claim 1, wherein the inductor is mounted on the mounting surface of the multilayer substrate or disposed inside the multilayer substrate; and
   the inductor and the matching circuit are adjacent to or close to each other.

10. The high-frequency module according to claim 1, wherein the inductor is disposed inside the cover layer, and the inductor and the matching circuit are adjacent to or close to each other.

11. The high-frequency module according to claim 1, wherein both of the inductor and the matching circuit are disposed inside the cover layer.

12. The high-frequency module according to claim 1, wherein the inductor and the matching circuit at least partly overlap each other as seen in a plan view.

13. A high-frequency module comprising:
a first external connection terminal;
a second external connection terminal;
a filter unit connected between the first and second external connection terminals;
a matching circuit connected between the filter unit and at least one of the first and second external connection terminals;
an inductor connected between the filter unit and a ground;
a multilayer substrate;
a flat filter substrate including a first principal surface on which an IDT electrode included in the filter unit is disposed, the first principal surface being spaced apart from and opposite to a mounting surface of the multilayer substrate;
a connection electrode having a configuration that protrudes from the first principal surface and connecting the multilayer substrate and the filter substrate; and
a resin layer surrounding the mounting surface of the multilayer substrate provided with the filter substrate; wherein
the matching circuit is a series connection type matching circuit connected in series between the first external connection terminal and a first series connection terminal or connected in series between the second external connection terminal and a second series connection terminal;
the matching circuit is disposed inside the multilayer substrate; and
the inductor and the matching circuit are inductively or capacitively coupled to each other.

14. The high-frequency module according to claim 13, wherein the inductively or capacitively coupled inductor and matching circuit are inductively or capacitively coupled so as to allow a frequency at an attenuation pole outside a pass band of the filter unit to change.

15. The high-frequency module according to claim 13, wherein both of the inductor and the matching circuit are disposed inside the multilayer substrate.

16. The high-frequency module according to claim 15, wherein the inductor and the matching circuit are disposed on different layers of the multilayer substrate.

17. The high-frequency module according to claim 13, wherein the inductor and the matching circuit at least partly overlap each other as seen in a plan view.

18. The high-frequency module according to claim 13, further comprising a ground electrode disposed between the inductor and the matching circuit.

19. The high-frequency module according to claim 13, wherein the matching circuit is a first matching circuit connected between the filter unit and the first external connection terminal, and the high-frequency module further comprises a second matching circuit connected between the filter unit and the second external connection terminal, and two couplings selected from two inductive couplings, two capacitive couplings, or an inductive coupling and a capacitive coupling, between the inductor and the first and second matching circuits are formed.

* * * * *